USO10566064B2

(12) United States Patent
Miyazaki

(10) Patent No.: US 10,566,064 B2
(45) Date of Patent: *Feb. 18, 2020

(54) NONVOLATILE MEMORY DEVICE, SEMICONDUCTOR DEVICE, AND ELECTRONIC APPARATUS

(71) Applicant: SEIKO EPSON CORPORATION, Tokyo (JP)

(72) Inventor: Takeshi Miyazaki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/969,692

(22) Filed: May 2, 2018

(65) Prior Publication Data

US 2018/0336953 A1 Nov. 22, 2018

(30) Foreign Application Priority Data

May 16, 2017 (JP) .................. 2017-097041

(51) Int. Cl.
| | |
|---|---|
| G11C 16/28 | (2006.01) |
| G11C 7/06 | (2006.01) |
| G11C 11/56 | (2006.01) |
| G11C 16/30 | (2006.01) |
| G11C 16/34 | (2006.01) |
| G11C 16/04 | (2006.01) |

(52) U.S. Cl.
CPC .............. *G11C 16/28* (2013.01); *G11C 7/062* (2013.01); *G11C 7/067* (2013.01); *G11C 11/5642* (2013.01); *G11C 16/0408* (2013.01); *G11C 16/30* (2013.01); *G11C 16/3459* (2013.01); *G11C 2207/063* (2013.01); *G11C 2211/5634* (2013.01)

(58) Field of Classification Search
CPC ..... G11C 16/28; G11C 7/067; G11C 11/5642; G11C 7/062; G11C 16/0408; G11C 16/3459; G11C 2207/063; G11C 16/30; G11C 2211/5634
USPC .................................................... 365/185.21
See application file for complete search history.

(56) References Cited

U.S. PATENT DOCUMENTS

2007/0170956 A1 7/2007 Su et al.
2015/0170726 A1 6/2015 Antonyan
(Continued)

FOREIGN PATENT DOCUMENTS

JP 2012-146374 A 8/2012
JP 2016-170846 A 9/2016
(Continued)

*Primary Examiner* — Fernando Hidalgo
(74) *Attorney, Agent, or Firm* — Oliff PLC

(57) ABSTRACT

A nonvolatile memory device includes: a plurality of first reference cells that are connected in parallel, and are in an intermediate state between an erased state and a programmed state; a first current mirror circuit that generates a first mirror current proportional to a sum of currents flowing through the plurality of first reference cells in a state in which the plurality of first reference cells are selected; and a sense amplifier that, in a readout mode, generates a reference current based on at least the first mirror current, and reads out data stored in a memory cell by comparing a current flowing through the memory cell with the reference current.

10 Claims, 9 Drawing Sheets

(56) References Cited

U.S. PATENT DOCUMENTS

2016/0239367 A1* 8/2016 Park ..................... G11C 29/24
2018/0336953 A1   11/2018 Miyazaki

FOREIGN PATENT DOCUMENTS

| JP | 2016-170847 A | 9/2016 |
| JP | 2016-225004 A | 12/2016 |

* cited by examiner

NONVOLATILE MEMORY DEVICE, SEMICONDUCTOR DEVICE, AND ELECTRONIC APPARATUS

CROSS REFERENCE

This application claims priority to Japanese Patent Application No. 2017-097941, filed on May 16, 2017, the entire disclosure of which is expressly incorporated herein by reference.

BACKGROUND

1. Technical Field

The present invention relates to electrically rewritable nonvolatile memory devices such as a flash memory and an EEPROM (Electrically Erasable Programmable Read-Only Memory). Furthermore, the invention relates to semiconductor devices, electronic apparatuses, and the like that use such nonvolatile memory devices.

2. Related Art

In recent years, electrically rewritable nonvolatile memory devices such as a flash memory and an EEPROM have come into wide used. In such nonvolatile memory devices, in order to determine whether a memory cell is in an erased state or in a programmed state, a reference current is generated based on currents that flow through a plurality of reference cells, and the current flowing through the memory cell is compared with the reference current.

As a related technology, in JP-A-2012-146374 (Paragraphs 0025 and 0026, 0078 and 0079, FIGS. 1 and 4), a reference current generation circuit is disclosed with which an operation margin can be widened when data is read out from a nonvolatile memory cell. The reference current generation circuit includes a first reference cell that is set in the erased state and a second reference cell that is set in the programmed state, and a current resulting from adding a current corresponding to a first current that flows through the first reference cell in a selected state and a current corresponding to a second current that flows through the second reference cell in a selected state is generated as the reference current.

However, in the case where the number of bits of data that is read at the same time in a readout mode is large, a current mirror circuit that generates a current corresponding to the current flowing through a reference cell is connected to a large number of sense amplifiers, and an interconnect length increases, and as a result, the load capacitance of the current mirror circuit increases, and it takes time for the reference current to stabilize. Specifically, the problem becomes apparent with respect to the programmed state-reference cell whose threshold voltage is high, because the current supply capability is low. Also, when the threshold voltage of the reference cell variates due to process variations, the operation margin in reading out data decreases.

An advantage of some aspects of the invention is to provide a nonvolatile memory device in which the current supply capability of a reference cell used for generating a reference current is improved so as to reduce the time it takes for the reference current to stabilize in a readout mode. Also, another advantage of some aspects of the invention is to reduce the influence of variation in the threshold voltage of the reference cell due to process variations in such a nonvolatile memory device. A further advantage of some aspects of the invention is to provide a semiconductor device, an electronic apparatus, and the like that use such a nonvolatile memory device.

A nonvolatile memory device according to a first aspect of the invention includes: a plurality of first reference cells that are connected in parallel, and are in an intermediate state between an erased state and a programmed state; a first current mirror circuit that generates a first mirror current proportional to a sum of currents flowing through the plurality of first reference cells in a state in which the plurality of first reference cells are selected; and a sense amplifier that, in a readout mode, generates a reference current based on at least the first mirror current, and reads out data stored in a memory cell by comparing a current flowing through the memory cell with the reference current.

According to the first aspect of the invention, as a result of providing the plurality of intermediate state-first reference cells whose threshold voltage is lower than that in the programmed state, the current supply capability of a reference cell used for generating the reference current is improved so as to reduce the time it takes for the reference current to stabilize in the readout mode. As a result, high-speed readout of data is made possible. Also, as a result of proving the plurality of first reference cells, the influence of variation in the threshold voltage of the reference cell due to process variations can be reduced.

Here, the nonvolatile memory device may further include: at least one second reference cell in the erased state; a second current mirror circuit that generates a second mirror current proportional to a current flowing through the at least one second reference cell in a state in which the at least one second reference cell is selected; and a selection circuit that sets a selection state of the plurality of first reference cells and the at least one second reference cell such that, in the readout mode, the reference current is generated based on at least the first mirror current, and in a verify mode, the reference current is generated based on at least the second mirror current.

Accordingly, in the verify mode, the reference current is generated based on at least the second mirror current that is proportional to the current flowing through the erased state-second reference cell whose threshold voltage is low, and as a result, a reference current that moderately changes relative to that in the readout mode with respect to the change in the drive potential applied to the cell can be generated, and when verifying whether or not the memory cell is properly programmed to the programmed state in which the threshold voltage is high, the determination reference can be precisely set.

Also, a plurality of bit lines respectively connected to the plurality of first reference cells may be respectively arranged on lines extended from a plurality of bit lines that are each connected to a plurality of memory cells. With this, data can be written into the plurality of first reference cells such that the plurality of first reference cells can be set to a desired memory state, similarly to the memory cells. Furthermore, because a memory control circuit can be shared between the plurality of first reference cells and the memory cells, the chip area can be reduced.

Alternatively, at least one bit line that is connected to the at least one second reference cell may be arranged on a line extended from at least one bit line connected to at least one memory cell. With this, data stored in the at least one second reference cell can be erased such that the second reference cell is set to the erased state, similarly to the memory cells. Furthermore, because the memory control circuit can be shared between the at least one second reference cell and the memory cells, the chip area can be reduced.

Alternatively, the plurality of first reference cells may be arranged along a predetermined word line. Furthermore, the at least one second reference cell may be arranged along the predetermined word line. With this, the control gates of the transistors of the plurality of first reference cells or the transistor of the at least one second reference cell can be formed by a portion of the predetermined word line.

A nonvolatile memory device according to a second aspect of the invention includes: a first reference cell in an intermediate state between an erased state and an programmed state; a second reference cell in the erased state; a first current mirror circuit that generates a first mirror current proportional to a current flowing through the first reference cell in a state in which the first reference cell is selected; a second current mirror circuit that generates a second mirror current proportional to a current flowing through the second reference cell in a state in which the second reference cell is selected; a sense amplifier that reads out data stored in a memory cell by comparing a current flowing through the memory cell with a reference current; and a selection circuit that sets a selection state of the first and second reference cells such that, in a readout mode, the reference current is generated based on at least the first mirror current, and in a verify mode, the reference current is generated based on at least the second mirror current.

According to the second aspect of the invention, as a result of providing the intermediate state-first reference cell whose threshold voltage is low relative to that in the programmed state, the current supply capability of a reference cell used for generating the reference current can be improved, and it is possible to reduce the time it takes for the reference current to stabilize in the readout mode. As a result, high-speed readout of data is made possible. On the other hand, in the verify mode, the reference current is generated based on at least the second mirror current that is proportional to the current flowing through the erased state-second reference cell whose threshold voltage is low, and as a result, the reference current that moderately changes relative to that in the readout mode with respect to the change in the drive potential applied to the cell can be generated, and the determination reference can be precisely set when verifying whether or not a memory cell has been properly programmed to the programmed state in which the threshold voltage of the memory cell is high.

A semiconductor device according to a third aspect of the invention and an electronic apparatus according to a fourth aspect of the invention include any of the nonvolatile memory device described above. According to the third or fourth aspect of the invention, a semiconductor device or an electronic apparatus can be provided in which, in the nonvolatile memory device, the current supply capability of a reference cell used for generating the reference current is improved, and high-speed readout of data is made possible.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
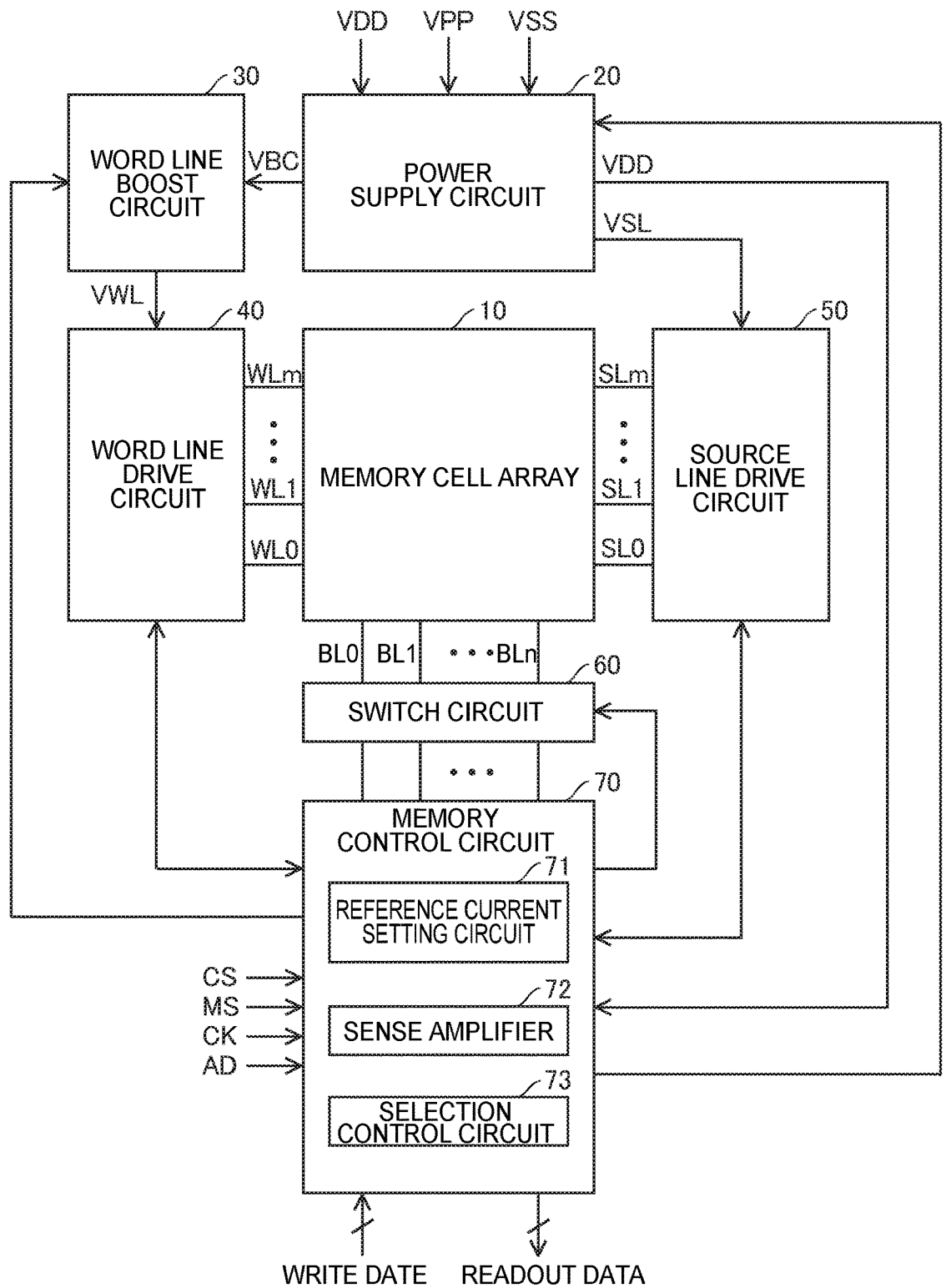
FIG. 1 is a block diagram illustrating an exemplary configuration of a nonvolatile memory device according to one embodiment of the invention.

Hereinafter, embodiments of the invention will be described in detail with reference to the drawings. The same constituent elements are given the same reference numerals, and a redundant description is omitted.

Although the invention can be applied to various types of electrically rewritable nonvolatile memory devices such as a flash memory and an EEPROM, in the following, an embodiment in which the invention is applied to a flash memory will be described as an example.

Overall Configuration of Nonvolatile Memory Device

FIG. 1 is a block diagram illustrating an exemplary configuration of a nonvolatile memory device according to one embodiment of the invention. As shown in FIG. 1, the nonvolatile memory device includes a memory cell array 10, a power supply circuit 20, a word line boost circuit 30, a word line drive circuit 40, a source line drive circuit 50, a switch circuit 60, and a memory control circuit 70.

In the memory cell array 10, a plurality of memory cells are arranged in a matrix of m rows and n columns (m and n are integers of two or more). For example, the memory cell array 10 includes memory cells of 2048 rows. Also, one row of memory cells include 1024 memory cells, and can store 128 pieces of 8-bit data.

Also, the memory cell array 10 includes a plurality of word lines WL0, WL1, . . . , WLm, a plurality of source lines SL0, SL1, . . . , SLm, and a plurality of bit lines BL0, BL1, . . . , BLn. Each word line and the associated source line are connected to a plurality of memory cells that are arranged in the corresponding row. Also, each bit line is connected to a plurality of memory cells arranged in the corresponding column.

The power supply circuit 20 is externally supplied with a logic power supply potential VDD for logic circuits and data readout, a high power supply potential VPP for writing and erasing data, and a reference power supply potential VSS, for example. Alternatively, the power supply circuit 20 may boost or step down an externally supplied power supply potential to generate other power supply potentials.

The reference power supply potential VSS is a reference potential serving as a relative reference for the other potentials, and in the following, a case where the reference power supply potential VSS is the ground potential (0V) will be described. The logic power supply potential VDD is a potential higher than the reference power supply potential VSS, and is about 1.2 V to 1.8 V inclusive, for example.

Note that the logic power supply potential VDD may be in common with a power supply potential for a functional circuit that is used along with the nonvolatile memory device. The high power supply potential VPP is a potential higher than the logic power supply potential VDD, and is about 5 V to 10 V inclusive, for example.

The power supply circuit 20 supplies the logic power supply potential VDD to the memory control circuit 70, and supplies the high power supply potential VPP and the logic power supply potential VDD to the units of the nonvolatile memory device as necessary, under the control of the memory control circuit 70. In FIG. 1, a power supply potential that is supplied from the power supply circuit 20 to the word line boost circuit 30 is denoted as a boost circuit power supply potential VBC, and a power supply potential that is supplied from the word line boost circuit 30 to the word line drive circuit 40 is denoted as a word line power supply potential VWL. Also, the power supply potential that is supplied from the power supply circuit 20 to the source line drive circuit 50 is denoted as a source line power supply potential VSL.

For example, in a write mode in which data is to be written into a memory cell and in an erase mode in which a memory cell is to be erased, the power supply circuit 20 supplies the high power supply potential VPP to the word line boost circuit 30 and the source line drive circuit 50. The word line boost circuit 30 supplies the high power supply potential VPP to the word line drive circuit 40.

Also, in a readout mode in which data is to be read out from a memory cell and in a verify mode in which whether or not data is properly written into a memory cell is verified, the power supply circuit 20 supplies the logic power supply potential VDD to the word line boost circuit 30 and the source line drive circuit 50. In the readout mode, the word line boost circuit 30 boosts the logic power supply potential VDD so as to generate a boosted word line potential VUP (2.8 V, for example), and supplies the boosted word line potential VUP to the word line drive circuit 40. In the verify mode, the word line boost circuit 30 supplies the logic power supply potential VDD or the boosted word line potential VUP to the word line drive circuit 40.

The word line drive circuit 40 is connected to the plurality of word lines WL0, WL1, . . . , WLm, and drives the word line connected to the memory cells selected by the memory control circuit 70. The source line drive circuit 50 is connected to the plurality of source lines SL1, SL2, . . . , SLm, and drives the source line connected to the memory cells selected by the memory control circuit 70.

The switch circuit 60 includes a plurality of N-channel MOS transistors respectively connected to the plurality of bit lines BL0, BL1, . . . , BLn, for example, and these transistors are each turned on or off, under the control of the memory control circuit 70. The memory control circuit 70 can be connected to the memory cells connected to the plurality of bit lines BL0, BL1, . . . , BLn via the switch circuit 60.

The memory control circuit 70 controls the circuits ranging from the power supply circuit 20 to the switch circuit 60 such that a write operation, a readout operation, a verify operation, or an erase operation is performed on the plurality of memory cells included in the memory cell array 10. For example, the memory control circuit 70 is constituted by a logic circuit, an analog circuit, and the like, and includes a reference current setting circuit 71, a sense amplifier 72, and a selection control circuit 73.

The reference current setting circuit 71 sets a reference current using a selected reference cell in the readout mode and the verify mode. The sense amplifier 72 reads out data stored in a memory cell by comparing the current flowing through the memory cell with the reference current. The selection control circuit 73 is a control circuit that controls the selection of the reference cell in the reference current setting circuit 71.

The memory control circuit 70 is supplied with a chip select signal CS, a mode select signal MS, a clock signal CK, and an address signal AD. The memory control circuit 70, when the nonvolatile memory device is selected in accordance with the chip select signal CS, sets the nonvolatile memory device to the write mode, the readout mode, the verify mode, or the erase mode, in accordance with the mode select signal MS.

In the write mode, the memory control circuit 70 receives an input of write data in synchronization with the clock signal CK, and controls the units of the nonvolatile memory device such that the data is written into the memory cell designated by the address signal AD. Also, in the readout mode and the verify mode, the memory control circuit 70 controls the units of the nonvolatile memory device such that the data is read out from the memory cell designated by the address signal AD, and outputs the readout data in synchronization with the clock signal CK.

Memory Cell Array

Figure 2:
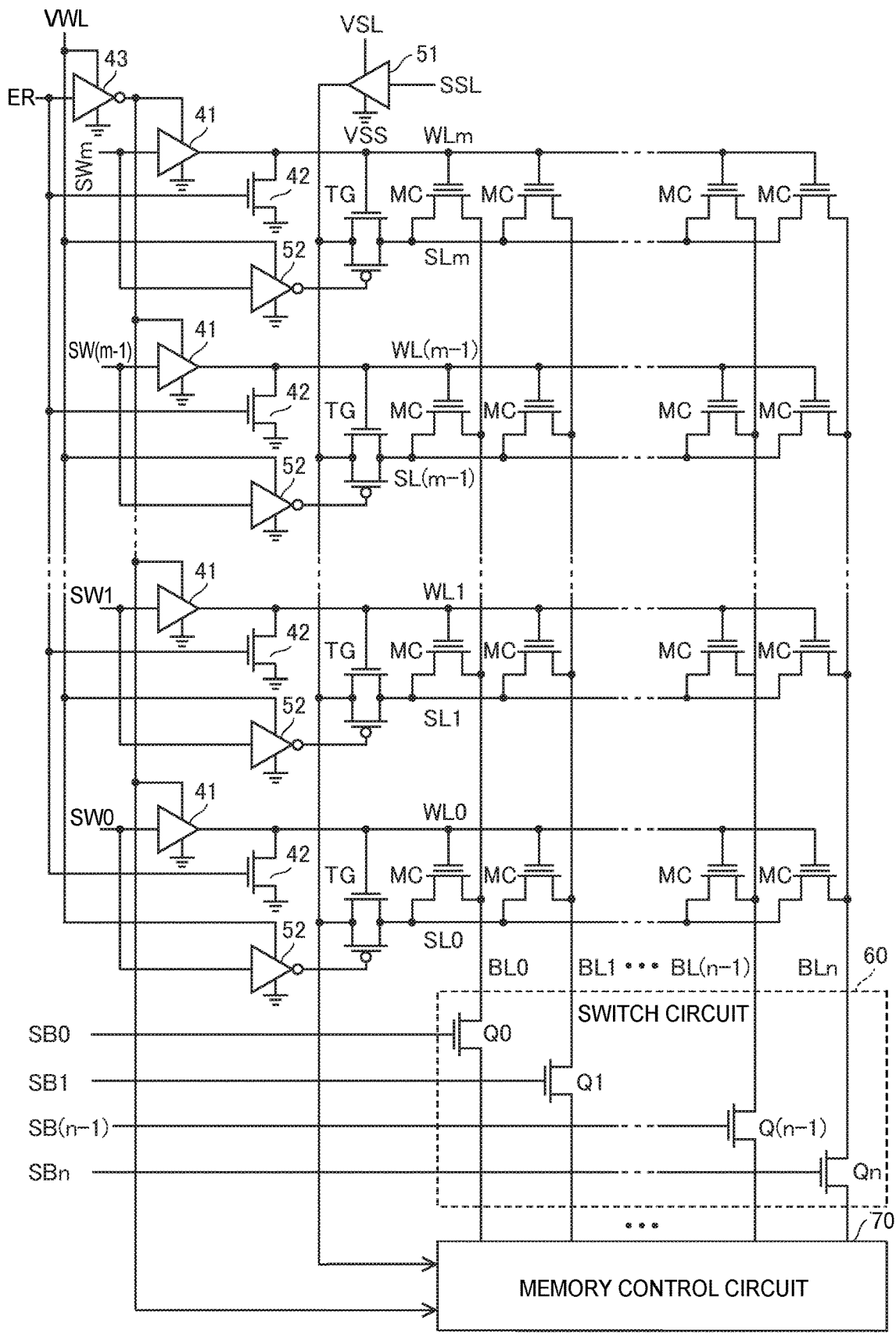
FIG. 2 is a circuit diagram illustrating an exemplary configuration of a memory cell array and a surrounding region thereof shown in FIG. 1.

FIG. 2 is a circuit diagram illustrating an exemplary configuration of the memory cell array and a surrounding region thereof shown in FIG. 1. Each memory cell MC is constituted by an N-channel MOS transistor that has a control gate, a floating gate, a source, and a drain, for example. The transistor of the memory cell MC stores 1-bit data utilizing charges accumulated in the floating gate.

Each of the word lines WL0 to WLm is connected to the control gates of the transistors of the plurality of memory cells MC that are arranged in the corresponding row. Each of the source lines SL0 to SLm is connected to the sources of the transistors of the plurality of memory cells MC that are arranged in the corresponding row. Also, each of the bit lines BL0 to BLn is connected to the drains of the transistors of the plurality of memory cells MC that are arranged in the corresponding column.

The word line drive circuit 40 (FIG. 1) includes a plurality of word line drivers 41 that are respectively connected to the word lines WL0 to WLm so as to drive the control gates of the transistors of the memory cells MC connected to the word lines WL0 to WLm, a plurality of N-channel MOS transistors 42, and an inverter 43. The word line driver 41 is constituted by a level shifter, a buffer circuit, an inverter, or the like, for example.

The word line power supply potential VWL is supplied to the inverter 43 from the power supply circuit 20 (FIG. 1). An erase mode signal ER that is activated to a high level in the erase mode is applied to an input terminal of the inverter 43 from the memory control circuit 70. When the erase mode signal ER is deactivated to a low level, the inverter 43 supplies the word line power supply potential VWL to the plurality of word line drivers 41.

Word line selection signals SW0 to SWm, which are activated to a high level when one or a plurality of rows of memory cells from the plurality of memory cells that constitute the memory cell array are selected, are respectively input to input terminals of the plurality of word line drivers 41 from the memory control circuit 70. Each word line driver 41 outputs the word line power supply potential VWL to the word line when the word line selection signal is activated to a high level, and outputs the reference power supply potential VSS to the word line when the word line selection signal is deactivated to a low level.

The source line drive circuit 50 (FIG. 1) includes a source line driver 51, a plurality of transmission gates TG, and a plurality of inverters 52 in order to drive the sources of the transistors of the memory cells MC connected to the source lines SL0 to SLm. The source line driver 51 is constituted by a level shifter, a buffer circuit, an inverter, or the like, for example. The plurality of transmission gates TG are connected between an output terminal of the source line driver 51 and the respective source lines SL0 to SLm.

The source line power supply potential VSL is supplied to the source line driver 51 from the power supply circuit 20 (FIG. 1). A source line drive signal SSL that is activated to a high level when a high power supply potential is supplied to the source lines is input to an input terminal of the source line driver 51 from the memory control circuit 70. The source line driver 51 outputs the source line power supply potential VSL when the source line drive signal SSL is activated to a high level, and outputs the reference power supply potential VSS when the source line drive signal SSL is deactivated to a low level.

Each transmission gate TG is constituted by an N-channel MOS transistor and a P-channel MOS transistor, and functions as a switch circuit that opens and closes the connection between the output terminal of the source line driver 51 and the corresponding source line. In each transmission gate TG, a gate of the N-channel MOS transistor is connected to the output terminal of the word line driver 41, and a gate of the P-channel MOS transistor is connected to an output terminal of the inverter 52.

The word line power supply potential VWL is supplied to each inverter 52 from the word line drive circuit 40 (FIG. 1). The word line selection signals SW0 to SWm are respectively input to input terminals of the inverters 52 from the memory control circuit 70. The plurality of inverters 52 respectively invert the word line selection signals SW0 to SWm, and apply the inverted word line selection signals SW0 to SWm to the respective gates of the P-channel MOS transistors of the transmission gates TG.

The switch circuit 60 includes N-channel MOS transistors Q0 to Qn that are connected between the respective bit lines BL0 to BLn and the memory control circuit 70. Bit line selection signals SB0 to SBn that are activated to a high level when one or a plurality of columns of memory cells are selected from the plurality of memory cells that constitute the memory cell array are respectively input to gates of the transistors Q0 to Qn from the memory control circuit 70.

In the write mode, the memory control circuit 70, in order to select the word line and the bit line that are connected to the memory cell MC designated by the address signal, activates the corresponding word line selection signal and bit line selection signal to a high level, and deactivates the other word line selection signals and bit line selection signals to a low level, and activates the source line drive signal SSL to a high level. In the following, a case where the word line WL0 and the bit line BL0 are to be selected will be described, as an example.

The high power supply potential VPP is supplied to the inverter 43, the source line driver 51, and the inverters 52. The inverter 43 to which the erase mode signal ER that is deactivated to a low level is input supplies the high power supply potential VPP to the plurality of word line drivers 41. The word line driver 41 to which the word line selection signal SW0 that is activated to a high level is input outputs the high power supply potential VPP to the word line WL0. The source line driver 51 to which the source line drive signal SSL that is activated to a high level is input outputs the high power supply potential VPP.

The high power supply potential VPP is applied to the gate of the N-channel MOS transistor of the transmission gate TG connected to the word line WL0. Also, the inverter 52 to which the word line selection signal SW0 that is activated to a high level is input inverts the word line selection signal SW0, and applies the reference power supply potential VSS to the gate of the P-channel MOS transistor of the transmission gate TG. Accordingly, the transmission gate TG connected to the word line WL0 is turned on, and the high power supply potential VPP output from the source line driver 51 is output to the source line SL0.

Also, the transistor Q0 of the switch circuit 60 to which the bit line selection signal SB0 that is activated to a high level is input is turned on, and the memory control circuit 70 outputs the reference power supply potential VSS to the bit line BL0. In this way, the memory control circuit 70 controls the word line drive circuit 40 (FIG. 1) and the source line drive circuit 50 (FIG. 1) such that the high power supply potential VPP is applied to the control gate and source of the transistor of the memory cell MC that is designated by the address signal, and applies the reference power supply potential VSS to the drain.

As a result, a current flows from the source to the drain of the transistor of the memory cell MC designated by the address signal. Hot carriers (electrons, in the present embodiment) generated due to the flowing current are injected into the floating gate, negative charges are accumulated in the floating gate, and as a result, the threshold voltage of the transistor increases.

On the other hand, the word line drivers 41 to which the word line selection signals SW1 to SWm that are deactivated to a low level are respectively input output the reference power supply potential VSS to the word lines WL1 to WLm. The reference power supply potential VSS is applied to the gates of the N-channel MOS transistors of the transmission gates TG connected to the word lines WL1 to WLm. Also, the plurality of inverters 52 to which the word line selection signals SW1 to SWm that are deactivated to a low level are respectively input invert the respective word line selection signals SW1 to SWm, and apply the high power supply potential VPP to the gates of the P-channel MOS transistors of the transmission gates TG. Accordingly, the transmission gates TG that are connected to the word lines WL1 to WLm are turned off.

Also, the transistors Q1 to Qn of the switch circuit 60 to which the bit line selection signals SB1 to SBn that are deactivated to a low level are respectively input are turned off. As a result, a current does not flow between the source and drain of the transistor of each of the memory cells MC that are not designated by the address signal, and therefore the threshold voltage of each of the transistors does not change.

In the erase mode, the memory control circuit 70, in order to select the word line connected to the memory cell MC designated by the address signal, activates the corresponding word line selection signal to a high level, and deactivates the other word line selection signals to a low level, and deactivates the bit line selection signals SB0 to SBn to a low level and activates the source line drive signal SSL to a high level. In the following, a case where the word line WL0 is to be selected will be described, as an example.

The high power supply potential VPP is supplied to the inverter 43, the source line driver 51, and the inverters 52. The inverter 43 to which the erase mode signal ER that is activated to a high level is input supplies the reference power supply potential VSS to the plurality of word line drivers 41 so as to stop operations.

The plurality of N-channel MOS transistors 42 to whose gates the erase mode signal ER that is activated to a high level is applied are turned on, and supplies the reference power supply potential VSS to the word lines WL0 to WLm. Also, the source line driver 51 to which the source line drive signal SSL that is activated to a high level is input outputs the high power supply potential VPP.

The inverter 52 to which the word line selection signal SW0 that is activated to a high level is input inverts the word line selection signal SW0, and applies the reference power supply potential VSS to the gate of the P-channel MOS transistor of the transmission gate TG. Accordingly, the transmission gate TG that is connected to the word line WL0 is turned on, and outputs the high power supply potential VPP output from the source line driver 51 to the source line SL0.

Also, the transistors Q0 to Qn of the switch circuit 60 to which the bit line selection signals SB0 to SBn that are deactivated to a low level are respectively input are turned off. In this way, the memory control circuit 70 controls the word line drive circuit 40 (FIG. 1) such that the drains of the transistors of the plurality of memory cells MC are in an open state (high impedance state), and the reference power supply potential VSS is applied to the control gates, and controls the source line drive circuit 50 (FIG. 1) such that the high power supply potential VPP is applied to the sources of the transistors of the memory cells MC connected to the word line WL0. As a result, if negative charges are accumulated in the floating gate of the transistor of a memory cell MC connected to the word line WL0, the negative charges accumulated in the floating gate are discharged to the source, and the threshold voltage of the transistor decreases.

On the other hand, the plurality of inverters 52, to which the word line selection signals SW1 to SWm that are deactivated to a low level are respectively input, invert the word line selection signals SW1 to SWm, and apply the high power supply potential VPP to the gates of the P-channel MOS transistors of the transmission gates TG. Accordingly, the transmission gates TG connected to the word lines WL1 to WLm are turned off. As a result, negative charges that are accumulated in the floating gate of the transistor of each of the memory cells MC connected to the word lines WL1 to WLm are not discharged, and therefore the threshold voltage of each transistor does not change.

In the readout mode, in order to select the word line and bit line connected to the memory cell MC designated by the address signal, the memory control circuit 70 activates the corresponding word line selection signal and bit line selection signal to a high level, and deactivates the other word line selection signals and bit line selection signals to a low level, and deactivates the source line drive signal SSL to a low level. In the following, a case where the word line WL0 and the bit line BL0 are to be selected will be described, as an example.

The boosted word line potential VUP is supplied to the inverters 43 and 52, and the logic power supply potential VDD is supplied to the source line driver 51. The inverter 43, to which the erase mode signal ER that is deactivated to a low level is input, supplies the boosted word line potential VUP to the plurality of word line drivers 41. The word line driver 41, to which the word line selection signal SW0 that is activated to a high level is input, outputs the boosted word line potential VUP to the word line WL0. Also, the source line driver 51, to which the source line drive signal SSL that is deactivated to a low level is input, outputs the reference power supply potential VSS.

The boosted word line potential VUP is applied to the gate of the N-channel MOS transistor of the transmission gate TG that is connected to the word line WL0. Also, the inverter 52, to which the word line selection signal SW0 that is activated to a high level is input, inverts the word line selection signal SW0, and applies the reference power supply potential VSS to the gates of the P-channel MOS transistor of the transmission gate TG. Accordingly, the transmission gate TG connected to the word line WL0 is turned on, and outputs the reference power supply potential VSS that is output from the source line driver 51 to the source line SL0.

Also, the transistor Q0 of the switch circuit 60, to which the bit line selection signal SB0 that is activated to a high level is input, is turned on, and the memory control circuit 70 outputs a potential at a high level to the bit line BL0. In this way, the memory control circuit 70 controls the word line drive circuit 40 (FIG. 1) such that the boosted word line potential VUP is applied to the control gate of the transistor of the memory cell MC designated by the address signal, and controls the source line drive circuit 50 (FIG. 1) such that the reference power supply potential VSS is supplied to the source, and supplies the potential at a high level to the drain.

As a result, a drain current flows from the drain to the source of the transistor of the memory cell MC designated by the address signal. The magnitude of the drain current differs depending on the amount of negative charges accumulated in the floating gate, and as a result, the memory control circuit 70 can read out data from the memory cell MC based on the magnitude of the drain current.

Note that, in the verify mode, the logic power supply potential VDD, instead of the boosted word line potential VUP, may be supplied to the inverters 43 and 52.

Memory Control Circuit 1

Figure 3:
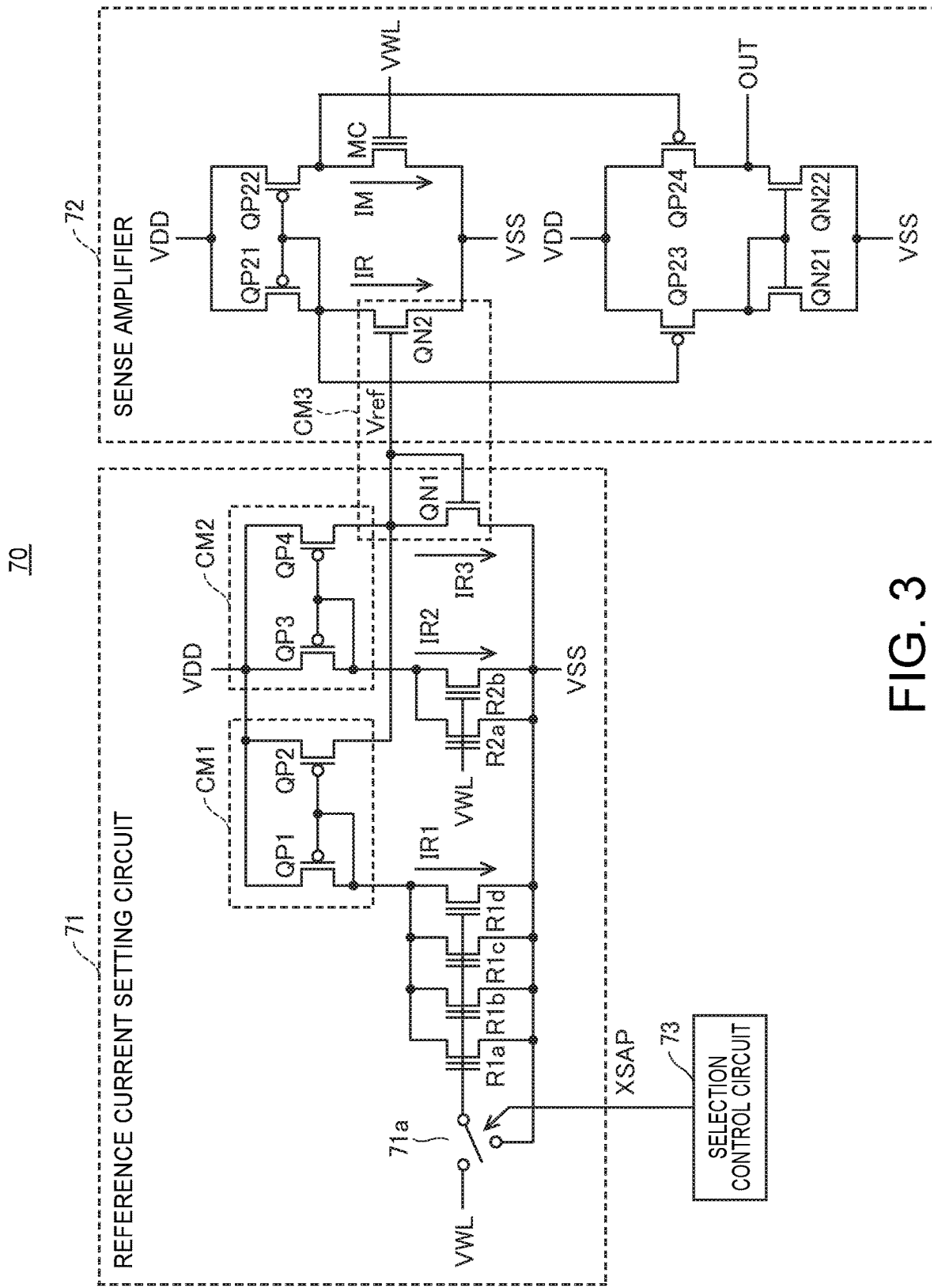
FIG. 3 is a circuit diagram illustrating a first exemplary configuration of a memory control circuit shown in FIG. 1.

FIG. 3 is a circuit diagram illustrating a first exemplary configuration of the memory control circuit 70 shown in FIG. 1. The reference current setting circuit 71, the sense amplifier 72, and the selection control circuit 73 are illustrated in FIG. 3.

A word line power supply potential (also referred to as a "drive potential") VWL is applied to the control gate of the transistor of the memory cell MC designated by the address signal from the word line drive circuit 40 (FIG. 1), and the reference power supply potential VSS is supplied to the source. With this, a current IM flows through the memory cell MC designated by the address signal depending on the stored data.

The reference current setting circuit 71 includes a plurality of first reference cells (four first reference cells R1a to R1d that are connected in parallel are shown in FIG. 3, as an example), at least one second reference cell (two second reference cells R2a and R2b that are connected in parallel are shown in FIG. 3, as an example), a first current mirror circuit CM1, a second current mirror circuit CM2, a selection circuit 71a, and an N-channel MOS transistor QN1.

The first reference cells R1a to R1d and the second reference cells R2a and R2b are each constituted by an N-channel MOS transistor with a control gate, a floating gate, a source, and a drain, similarly to the memory cell MC. The first reference cells R1a to R1d are set in an intermediate state between the erased state and the programmed (written) state, or in the programmed state. On the other hand, the second reference cells R2a and R2b are set to the erased state.

Here, the intermediate state between the erased state and the programmed state refers to a memory state in which, when the same drive potential is applied to a cell, the current I that flows through the cell is smaller than the current $I_E$ that flows through the erased state-memory cell, and is larger than the current $I_P$ that flows through the programmed state-memory cell.

$$I_P < I < I_E \quad (1)$$

That is, if the sizes of transistors that constitute a plurality of types of cells are the same, the transistor of a cell in the intermediate state has a higher threshold voltage than the transistor of an erased state-memory cell, and has a lower threshold voltage than the transistor of a programmed state-memory cell.

As shown in the expression (1), the current I may not strictly be of the intermediate value between the current $I_E$ and the current $I_P$. However, considering a shift and the like in the current value due to temperature characteristics of the current mirror circuit, in order to provide a margin with respect to the erased state and the programmed state, it is desirable that the intermediate state is set as shown in expression (2), and it is further desirable that the intermediate state is set as shown in expression (3).

$$1.1 \times I_P \leq I \leq 0.9 \times I_E \quad (2)$$

$$1.2 \times I_P \leq I \leq 0.8 \times I_E \quad (3)$$

Transistors of the first reference cells R1a to R1d and transistors of the second reference cells R2a and R2b each have a source supplied with the reference power supply potential VSS, and respectively allow currents IR1 and IR2 to flow, when a potential at a high level is applied to each drain, in accordance with a drive potential VWL applied to each control gate. Here, the current IR1 represents the sum of currents flowing through the first reference cells R1a to R1d, and the current IR2 represents the sum of currents flowing through the second reference cells R2a and R2b.

The first current mirror circuit CM1 generates, in a selected state of the first reference cells R1a to R1d, a first mirror current that is proportional to the current IR1 flowing through the first reference cells R1a to R1d. In the example shown in FIG. 3, the first current mirror circuit CM1 includes P-channel MOS transistors QP1 and QP2.

The transistor QP1 has a source supplied with the logic power supply potential VDD, and a gate and a drain that are connected to the drains of the transistors of the first reference cells R1a to R1d. The transistor QP2 has a source supplied with the logic power supply potential VDD and a gate connected to the gate and drain of the transistor QP1.

The second current mirror circuit CM2 generates, in a selected state of the second reference cells R2a and R2b, a second mirror current that is proportional to the current IR2 flowing through the second reference cells R2a and R2b. In the example shown in FIG. 3, the second reference cells R2a and R2b are always in the selected state in the readout mode and the verify mode. Also, the second current mirror circuit CM2 includes P-channel MOS transistors QP3 and QP4.

The transistor QP3 has a source supplied with the logic power supply potential VDD, and a gate and a drain that are connected to the drains of the transistors of the second reference cells R2a and R2b. The transistor QP4 has a source supplied with the logic power supply potential VDD and a gate connected to the gate and drain of the transistor QP3.

The transistor QN1 has a drain and a gate that are connected to a drain of the transistor QP2 in the first current mirror circuit CM1 and a drain of the transistor QP4 in the second current mirror circuit CM2, and a source supplied with the reference power supply potential VSS. The first or second mirror current flows through the transistor QN1 as a current IR3, and a reference potential Vref is generated at the drain and gate of the transistor QN1.

The sense amplifier 72 includes an N-channel MOS transistor QN2 that constitutes a third current mirror circuit CM3 together with the transistor QN1, and the transistor QN2 allows a reference current IR proportional to the current IR3 flowing through the transistor QN1 to flow. Accordingly, even if a current is amplified by the first current mirror circuit CM1 and the second current mirror circuit CM2 in order to drive the load, the magnitude of the reference current IR can be appropriately set by the third current mirror circuit CM3.

The transistor QN2 has a gate connected to the drain and gate of the transistor QN1, and a source supplied with the reference power supply potential VSS. Also, the sense amplifier 72 further includes P-channel MOS transistors QP21 to QP24 and N-channel MOS transistors QN21 and QN22.

The transistor QP21 has a source supplied with the logic power supply potential VDD, and a gate and a drain that are connected to the drain of the transistor QN2. The transistor QP22 has a source supplied with the logic power supply potential VDD, a gate connected to the gate and drain of the transistor QP21, and a drain to be connected to the drain of the transistor of a memory cell MC. Here, the transistors QP21 and QP22 constitute a current mirror circuit.

The transistor QP23 has a source supplied with the logic power supply potential VDD, and a gate connected to the drain of the transistor QN2. The transistor QP24 has a source supplied with the logic power supply potential VDD, and a gate to be connected to the drain of the transistor of the memory cell MC. Here, the transistors QP23 and QP24 constitute the differential pair of a differential amplifier.

The transistor QN21 has a drain and a gate that are connected to a drain of the transistor QP23 and a source supplied with the reference power supply potential VSS. The transistor QN22 has a drain connected to a drain of the transistor QP24, a gate connected to the drain and gate of the transistor QN21, and a source supplied with the reference power supply potential VSS. Here, the transistors QN21 and QN22 constitute a current mirror circuit. An output signal OUT of the sense amplifier 72 is generated at a connection point between the transistor QP24 and the transistor QN22.

The sense amplifier 72 reads out data stored in the memory cell MC by comparing the current IM flowing through the memory cell MC with the reference current IR. For example, the sense amplifier 72, when the current IM flowing through the memory cell MC is larger than the reference current IR, brings the output signal OUT to a high level, and when the current IM flowing through the memory cell MC is smaller than the reference current IR, brings the output signal OUT to a low level.

The selection circuit 71a sets the selection state of the first reference cells R1a to R1d and the second reference cells R2a and R2b such that, in the readout mode, the reference current IR is generated based on at least the first mirror current, and in the verify mode, the reference current IR is generated based on at least the second mirror current. Accordingly, the sense amplifier 72 generates, in the readout mode, a reference current IR based on at least the first mirror current, and in the verify mode, a reference current IR based on at least the second mirror current.

In the example shown in FIG. 3, the selection circuit 71a is connected between the word line drive circuit 40 (FIG. 1)

and the control gates of the transistors of the first reference cells R1a to R1d. Alternatively, the selection circuit 71a may be connected between an interconnect of the logic power supply potential VDD and the source of the transistor QP1 or QP2, connected between the drain of the transistor QP1 and the drains of the transistors of the first reference cells R1a to R1d, or connected between the drain of the transistor QP2 and the drain of the transistor QN1.

In such cases, the selection circuit 71a sets the connection state of the first reference cells R1a to R1d or the first current mirror circuit CM1 such that the first mirror current is generated in the readout mode, and the first mirror current is not generated in the verify mode. With this, the first reference cells R1a to R1d can be set to a selected or unselected state.

For example, the selection circuit 71a is constituted by a plurality of analog switches or the like, selects one of the drive potential VWL and the reference power supply potential VSS in accordance with a control signal XSAP supplied from the selection control circuit 73, and applies the selected potential to the control gates of the transistors of the first reference cells R1a to R1d.

In the readout mode, as a result of the selection control circuit 73 activating the control signal XSAP to a low level, the selection circuit 71a applies the drive potential VWL to the control gates of the transistors of the first reference cells R1a to R1d. Accordingly, a current IR1 flows through the first reference cells R1a to R1d, a first mirror current flows in the first current mirror circuit CM1, and a reference current IR is generated based on the first and second mirror currents. Accordingly, even in a low voltage state in which a current does not flow through the first reference cells R1a to R1d, the reference current IR can be generated using the second reference cells R2a and R2b.

In the verify mode, as a result of the selection control circuit 73 deactivating the control signal XSAP to a high level, the selection circuit 71a applies the reference power supply potential VSS to the control gates of the transistors of the first reference cells R1a to R1d. Accordingly, because there is no current flowing through the first reference cells R1a to R1d and in the first current mirror circuit CM1, the reference current IR is generated based on the second mirror current.

The first current mirror circuit CM1 generates the first mirror current having a magnitude that is a times the current IR1 flowing through the first reference cells R1a to R1d. Also, the second current mirror circuit CM2 generates the second mirror current having a magnitude that is b times the current IR2 flowing through the second reference cells R2a and R2b. Furthermore, the third current mirror circuit CM3 generates the reference current IR having a magnitude that is c times the first mirror current and the second mirror current.

Here, assuming that ac≈¼, and 0<bc<½, the third current mirror circuit CM3 generates a current having a magnitude that is approximately the same as the current flowing through the first reference cells R1a to R1d based on the first mirror current, and generates a current having a magnitude that is $\beta$ times (0<$\beta$<1) the current flowing through the second reference cells R2a and R2b based on the second mirror current. In the case where a=2, b=2, and c=⅛, $\beta$=½, for example. Alternatively, the setting is such that 0.2≤$\beta$≤0.6.

Accordingly, in the readout mode, the amount of change in the reference current IR with respect to the change in the drive potential VWL can approximate the amount of change in a current IR1 flowing through the first reference cells R1a to R1d, and the influence of the change in temperature and power supply voltage can be reduced. Also, in the verify mode, the amount of change in the reference current IR with respect to the change in the drive potential VWL can be made relatively small, and the determination reference can be precisely set when verifying whether or not the memory cell MC is properly programmed.

Figure 4:
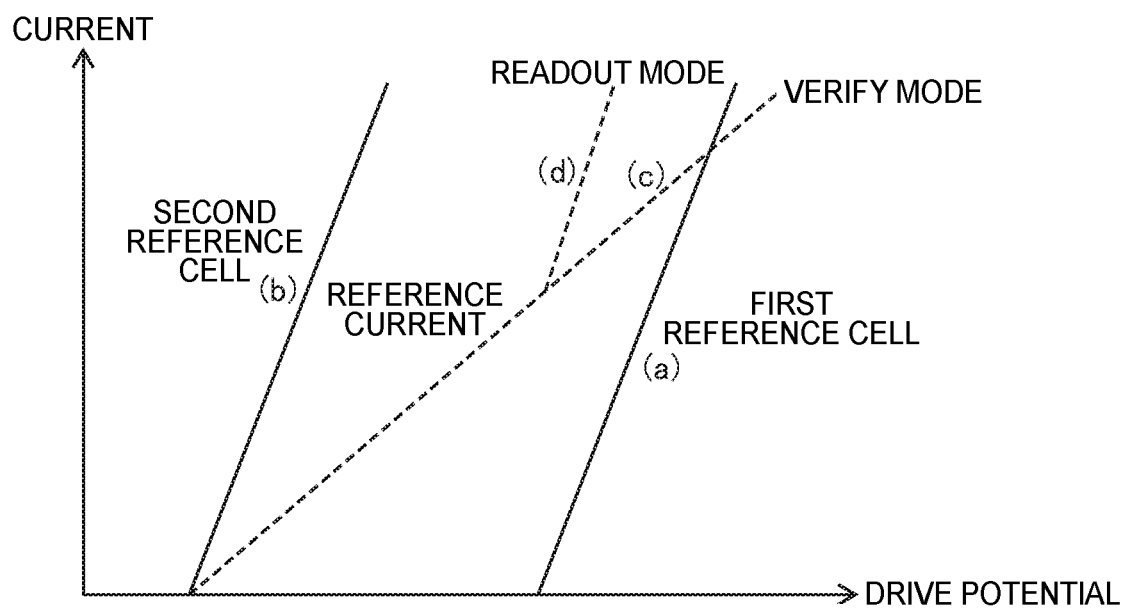
FIG. 4 is a diagram illustrating an exemplary setting of a reference current set by a reference current setting circuit.

FIG. 4 is a diagram illustrating an exemplary setting of the reference current set by the reference current setting circuit 71 shown in FIG. 3. In FIG. 4, the horizontal axis shows the drive potential applied to the first reference cells R1a to R1d and the second reference cells R2a and R2b, and the vertical axis shows the current flowing according to the drive potential. Also, the solid line (a) shows the current flowing through the first reference cells R1a to R1d, and the solid line (b) shows the current flowing through the second reference cells R2a and R2b.

In the verify mode, a reference current IR shown by the broken line (c) having a magnitude of approximately one third of the current IR2 flowing through the second reference cells R2a and R2b in the erased state can be obtained by the second current mirror circuit CM2 and the third current mirror circuit CM3, for example. In this way, as a result of making the amount of change in the reference current IR with respect to the change in the drive potential relatively small, the determination reference that is used when verifying whether or not a memory cell MC has been properly programmed can be precisely set.

On the other hand, in the readout mode, a reference current IR shown by the broken line (d) can be obtained by adding a current having a magnitude approximately the same as the current IR1 flowing through the first reference cells R1a to R1d in the intermediate state between the erased state and the programmed state and a current having a magnitude of approximately one third of the current IR2 flowing through the erased state-second reference cells R2a and R2b, for example. As a result of the amount of change in the reference current IR with respect to the change in the drive potential approximating the amount of change in the current flowing through the first reference cells R1a to R1d, the influence of a change in temperature or the power supply voltage can be reduced.

Furthermore, in the verify mode, different reference currents IR may be used in an erase verify in which it is determined whether or not a memory cell MC is properly erased, and in a program verify in which it is determined whether or not a memory cell MC is properly programmed. Accordingly, the determination reference can be more precisely set, and the reliability of data stored in the memory cell MC can be improved.

For example, the reference current may be generated, when the erase verify is performed, by obtaining a current that has a magnitude that is approximately half of the current IR2 flowing through the second reference cells R2a and R2b, using the second current mirror circuit CM2 and the third current mirror circuit CM3, and when the program verify is performed, by obtaining a current that has a magnitude approximately one third of the current IR2 flowing through the second reference cells R2a and R2b, using the second current mirror circuit CM2 and the third current mirror circuit CM3.

According to the first exemplary configuration, as a result of providing the plurality of intermediate state-first reference cells whose threshold voltage is lower than that in the programmed state, the current supply capability of the reference cell used for generating the reference current IR can be improved, and the time it takes for the reference current IR to stabilize in the readout mode can be reduced. As a result, high-speed readout of data is made possible. Also, as a result of providing the plurality of first reference cells or the plurality of second reference cells, the influence of variation in the threshold voltage of the reference cell due to process variation can be reduced.

On the other hand, in the verify mode, the reference current IR is generated based on at least the second mirror current proportional to the current flowing through the erased state-second reference cells whose threshold voltage is low, and as a result, the reference current IR that moderately changes relative to that in the readout mode with respect to the change in the drive potential VWL applied to the cell can be generated, and the determination reference can be precisely set when verifying whether or not a memory cell MC has been properly programmed to a programmed state in which the threshold voltage of the memory cell is high.

Memory Control Circuit 2

Figure 5:
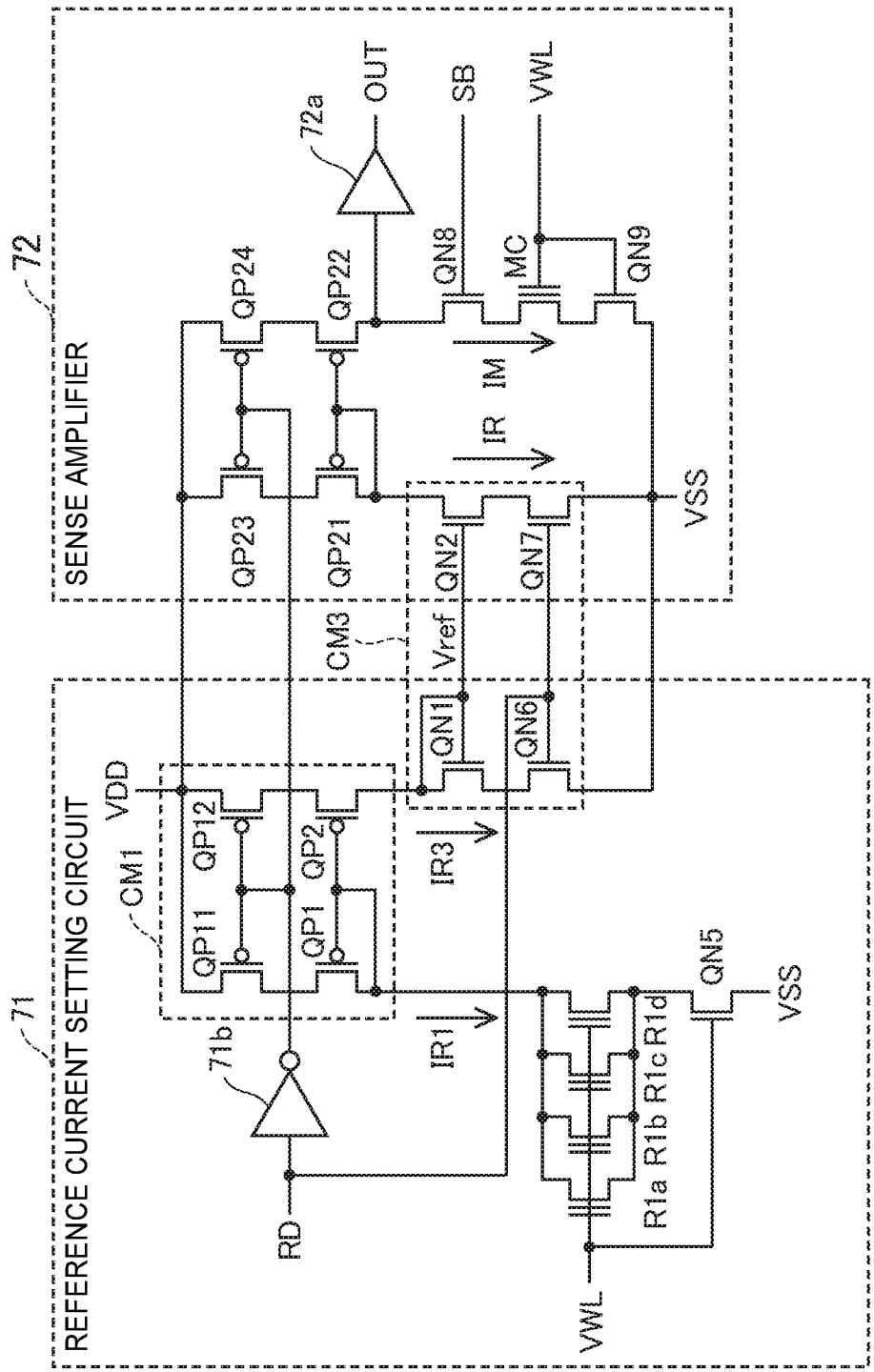
FIG. 5 is a circuit diagram illustrating a second exemplary configuration of the memory control circuit shown in FIG. 1.

FIG. 5 is a circuit diagram illustrating a second exemplary configuration of the memory control circuit 70 shown in FIG. 1. In the second exemplary configuration, the second reference cells R2a and R2b, the second current mirror circuit CM2, and the selection circuit 71a in the first exemplary configuration shown in FIG. 3 are omitted, and the configurations of other circuits are changed as well. In other respects, the second exemplary configuration may be similar to the first exemplary configuration.

As shown in FIG. 5, the reference current setting circuit 71 includes first reference cells R1a to R1d in the intermediate state between the erased state and the programmed state, the first current mirror circuit CM1, an inverter 71b, and N-channel MOS transistors QN1, QN5, and QN6.

The memory control circuit 70 activates the control signal RD to a high level in the readout mode and the verify mode. The inverter 71b inverts the control signal RD, and supplies the inverted control signal RD to the first current mirror circuit CM1 and the sense amplifier 72.

In the first current mirror circuit CM1, P-channel MOS transistors QP11 and QP12 are added in addition to the transistors QP1 and QP2 shown in FIG. 3. The transistors QP11 and QP12 are connected between an interconnect of the logic power supply potential VDD and the transistors QP1 and QP2, respectively, and are turned on when the control signal RD is activated to a high level.

The drive potential VWL is applied to the control gates of the transistors of the first reference cells R1a to R1d from the word line drive circuit 40 (FIG. 1). The transistor QN5 has a drain connected to the sources of the transistors of the first reference cells R1a to R1d, and a source supplied with the reference power supply potential VSS. The transistor QN5 is turned on in accordance with the drive potential VWL applied to the gate, and supplies the reference power supply potential VSS to the sources of the transistors of the first reference cells R1a to R1d.

With this, the first reference cells R1a to R1d allow the current IR1 to flow in accordance with the drive potential VWL applied to the control gates, when the control signal RD is activated to a high level. On the other hand, the transistor QN5 disconnects the sources of the transistors of the first reference cells R1a to R1d from the reference power supply potential VSS, when the drive potential VWL is not applied to the gate.

The first current mirror circuit CM1 generates the first mirror current that is proportional to the current IR1 flowing through the first reference cells R1a to R1d, when the control signal RD is activated to a high level.

The transistor QN1 has a drain and a gate that are connected to the drain of the transistor QP2 of the current mirror circuit CM1. The transistor QN6 has a drain connected to a source of the transistor QN1 and a source supplied with the reference power supply potential VSS, and is turned on when the control signal RD applied to a gate is activated to a high level. With this, the first mirror current flows through the transistors QN1 and QN6 as the current IR3.

The sense amplifier 72 includes P-channel MOS transistors QP23 and QP24, an N-channel MOS transistor QN7, and an output circuit 72a in addition to the transistors QN2, QP21, and QP22 shown in FIG. 3. Note that the N-channel MOS transistor QN8 is a transistor of the switch circuit 60 (FIG. 2), and the N-channel MOS transistor QN9 is a transistor of the transmission gate TG (FIG. 2).

The transistors QP23 and QP24 are connected between the interconnect of the logic power supply potential VDD and the transistors QP21 and QP22, respectively, and are turned on when the control signal RD is activated to a high level. The transistor QN7 has a drain connected to a source of the transistor QN2 and a source supplied with the reference power supply potential VSS, and is turned on when the control signal RD is activated to a high level. Therefore, the transistor QN2 allows the reference current IR that is proportional to the current IR3 flowing through the transistor QN1 to flow, when the control signal RD is activated to a high level.

At this time, the first current mirror circuit CM1 generates the first mirror current having a magnitude that is a times the current IR1 flowing through the first reference cells R1a to R1d. Also, the third current mirror circuit CM3 generates the reference current IR having a magnitude that is c times the first mirror current. Here, assuming that ac≈¼, the third current mirror circuit CM3 generates a current having a magnitude that is approximately the same as the current flowing through each of the first reference cells R1a to R1d, based on the first mirror current. For example, the setting may be such that a=2 and c=⅛.

As a result of providing the plurality of first reference cells in this way, when the reference current IR is fixed, in the first current mirror circuit CM1, the increase in current supply capability (proportional to the reciprocal of output impedance) is larger than the increase in gate capacitance. In the following description, the case where the size (gate width) ratio of the transistor QP1 and the transistor QP2 that constitute the first current mirror circuit CM1 is 1:8 is treated as a reference case.

For example, when two first reference cells are provided and the size of the transistor QP1 is doubled, while the gate capacitance becomes (2+8)/(1+8)≈1.1 times the original value, the current supply capability is approximately doubled. Alternatively, when four first reference cells are provided and the size of the transistor QP1 is quadrupled, while the gate capacitance becomes (4+8)/(1+8)≈1.3 times the original value, the current supply capability is approximately quadrupled.

The transistor QN8 has a drain connected to a drain of the transistor QP22 and a source connected to the drain of the transistor of a memory cell MC, and is turned on when the bit line selection signal SB for selecting the memory cell MC is activated to a high level. Also, the transistor QN9 has a drain connected to the source of the transistor of a memory cell MC and a source supplied with the reference power supply potential VSS, and is turned on in accordance with the drive potential VWL. Accordingly, when the control signal RD and the bit line selection signal SB are activated to a high level, a current IM flows through the memory cell MC, in accordance with the stored data, to which the drive potential VWL is applied.

The sense amplifier 72 compares, when the control signal RD is activated to a high level, the current IM flowing through the memory cell MC designated by the address signal with the reference current IR, and as a result, the data stored in the memory cell MC is read out. The output circuit 72a generates the output signal OUT based on the potential at the connection point between a drain of the transistor QP22 and a drain of the transistor QN8.

For example, the sense amplifier 72, when the current IM flowing through the memory cell MC is larger than the reference current IR, brings the output signal OUT to a low level, and when the current IM flowing through the memory cell MC is smaller than the reference current IR, brings the output signal OUT to a high level.

According to the second exemplary configuration, as a result of providing a plurality of intermediate state-first reference cells whose threshold voltage is lower than that in the programmed state, the current supply capability of the reference cells used for generating the reference current IR can be improved, and it is possible to reduce the time it takes for the reference current IR to stabilize in the readout mode. As a result, high-speed readout of data is made possible.

Memory Control Circuit 3

Figure 6:
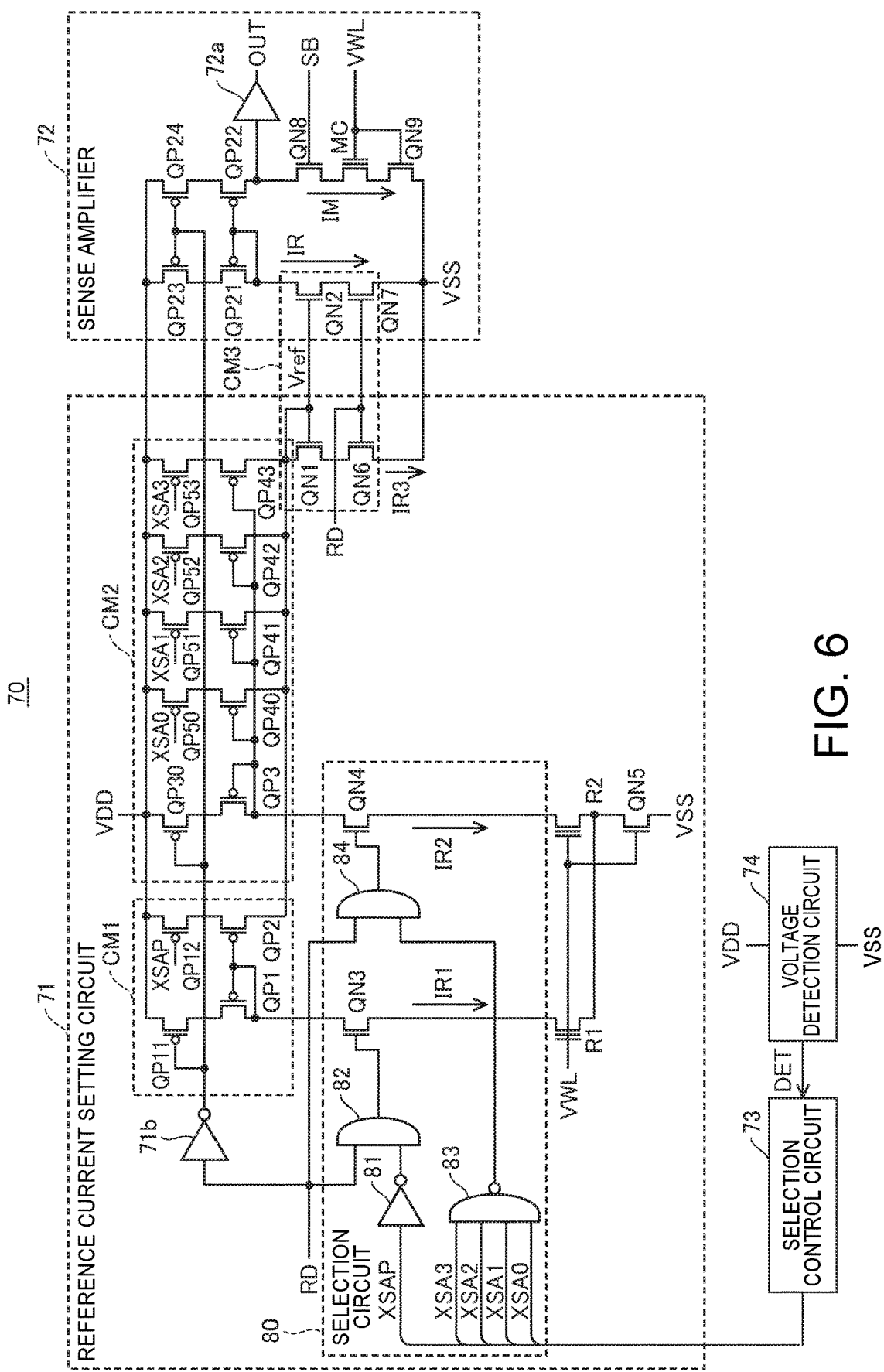
FIG. 6 is a circuit diagram illustrating a third exemplary configuration of the memory control circuit shown in FIG. 1.

FIG. 6 is a circuit diagram illustrating a third exemplary configuration of the memory control circuit 70 shown in FIG. 1. In the third exemplary configuration, the reference current setting circuit 71 includes at least one first reference cell R1 in the intermediate state between the erased state and the programmed state, at least one second reference cell R2 in the erased state, the first current mirror circuit CM1, the second current mirror circuit CM2, the inverter 71b, a selection circuit 80, and the N-channel MOS transistors QN1, QN5, and QN6.

The memory control circuit 70 activates the control signal RD to a high level in the readout mode and the verify mode. The inverter 71b inverts the control signal RD, and supplies the inverted control signal RD to the first current mirror circuit CM1, the second current mirror circuit CM2, and the sense amplifier 72.

The selection control circuit 73 activates a control signal XSAP to a low level when the first reference cell R1 is to be selected, and activates at least one of control signals XSA0 to XSA3 to a low level in accordance with the setting of the mirror ratio of the second current mirror circuit CM when the second reference cell R2 is to be selected.

In the first current mirror circuit CM1, the P-channel MOS transistors QP11 and QP12 are added in addition to the transistors QP1 and QP2 shown in FIG. 3. The transistor QP11 is connected between the interconnect of the logic power supply potential VDD and the transistor QP1, and is turned on when the control signal RD is activated to a high level. The transistor QP12 is connected between the interconnect of the logic power supply potential VDD and the transistor QP2, and is turned on when the control signal XSAP is activated to a low level.

In the second current mirror circuit CM2, P-channel MOS transistors QP40 to QP43 are provided in place of the transistor QP4 shown in FIG. 3, and transistors QP30, and QP50 to QP53 are added. The transistor QP30 is connected between the interconnect of the logic power supply potential VDD and the transistor QP3, and is turned on when the control signal RD is activated to a high level.

The transistor QP50 is connected between the interconnect of the logic power supply potential VDD and the transistor QP40, and is turned on when the control signal XSA0 is activated to a low level. The transistor QP51 is connected between the interconnect of the logic power supply potential VDD and the transistor QP41, and is turned on when the control signal XSA1 is activated to a low level.

The transistor QP52 is connected between the interconnect of the logic power supply potential VDD and the transistor QP42, and is turned on when the control signal XSA2 is activated to a low level. The transistor QP53 is connected between the interconnect of the logic power supply potential VDD and the transistor QP43, and is turned on when the control signal XSA3 is activated to a low level.

When at least one of the transistors QP50 to QP53 is turned on, at least one of the corresponding transistors QP40 to QP43 constitutes a current mirror circuit together with the transistor QP3. Accordingly, the second current mirror circuit CM2 is configured to be able to change the mirror ratio using the control signals XSA0 to XSA3.

With this, the determination reference in the verify mode can be set by changing the reference current IR with a simple configuration without increasing the number of reference cells and adjusting the drive potential of a reference cell. In the example shown in FIG. 5, the mirror ratio of the second current mirror circuit CM2 can be changed in 16 ways based on which of the transistors QP50 and QP53 are turned on.

The selection circuit 80 includes an inverter 81, AND circuits 82 and 84, a NAND circuit 83, and N-channel MOS transistors QN3 and QN4. The transistor QN3 has a drain that is connected to the drain of the transistor QP1 in the first current mirror circuit CM1, and a source that is connected to a drain of the transistor of the first reference cell R1. The transistor QN4 has a drain that is connected to a drain of the transistor QP3 in the second current mirror circuit CM2, and a source that is connected to a drain of the transistor of the second reference cell R2.

The inverter 81 inverts the control signal XSAP, and supplies the inverted control signal XSAP to the AND circuit 82. The AND circuit 82 applies an output signal at a high level to a gate of the transistor QN3 when the control signal RD is activated to a high level and the control signal XSAP is activated to a low level. With this, the transistor QN3 is turned on, and a potential at a high level is applied to the drain of the transistor of the first reference cell R1.

The NAND circuit 83 supplies an output signal at a high level to the AND circuit 84 when at least one of the control signals XSA0 to XSA3 is activated to a low level. The AND circuit 84 applies an output signal at a high level to a gate of the transistor QN4 when the control signal RD is activated to a high level and the output signal of the NAND circuit 83 is activated to a high level. With this, the transistor QN4 is turned on, and a potential at a high level is applied to the drain of the transistor of the second reference cell R2.

The drive potential VWL from the word line drive circuit 40 is applied to the control gates of the transistor of the first reference cell R1 and the transistor of the second reference cell R2 (FIG. 1). The transistor QN5 has a drain connected to sources of the transistor of the first reference cell R1 and the transistor of the second reference cell R2, and a source supplied with the reference power supply potential VSS. The transistor QN5 is turned on in accordance with the drive potential VWL applied to the gate, and supplies the reference power supply potential VSS to the sources of the transistor of the first reference cell R1 and the transistor of the second reference cell R2.

With this, the first reference cell R1 allows a current IR1 to flow in accordance with the drive potential VWL applied to the control gate, when the control signal RD is activated to a high level and the control signal XSAP is activated to a low level. Also, the second reference cell R2 allows a current IR2 to flow in accordance with the drive potential VWL applied to the control gate, when the control signal RD is activated to a high level and at least one of the control signals XSA0 to XSA3 is activated to a low level. On the other hand, the transistor QN5 disconnects the sources of the transistor of the first reference cell R1 and the transistor of the second reference cell R2 from the reference power supply potential VSS, when the drive potential VWL is not applied to the gate.

The first current mirror circuit CM1 generates the first mirror current that is proportional to the current IR1 flowing through the first reference cell R1, when the control signal RD is activated to a high level and the control signal XSAP is activated to a low level. The second current mirror circuit CM2 generates a second mirror current that is proportional to the current IR2 flowing through the second reference cell R2, when the control signal RD is activated to a high level and at least one of the control signals XSA0 to XSA3 is activated to a low level.

The transistor QN1 has a drain and the gate that are connected to the drain of the transistor QP2 in the first current mirror circuit CM1 and drains of the transistors QP40 to QP43 in the second current mirror circuit CM2. The transistor QN6 has a drain connected to the source of the transistor QN1 and a source supplied with the reference power supply potential VSS, and is turned on when the control signal RD is activated to a high level. With this, the first or second mirror current flows through the transistors QN1 and QN6 as the current IR3.

The sense amplifier 72 is configured similarly to the sense amplifier 72 shown in FIG. 5, and reads out data stored in the memory cell MC by comparing the current IM flowing through the memory cell MC designated by the address signal with the reference current IR, when the control signal RD is activated to a high level.

The selection circuit 80 sets the selection state of the first reference cell R1 and the second reference cell R2 such that the reference current IR is generated based on at least the first mirror current in the readout mode, and the reference current IR is generated based on at least the second mirror current in the verify mode.

Here, the selection circuit 80 may set the connection state of the first reference cell R1 or the first current mirror circuit CM1 such that the first mirror current is generated in the readout mode, and the first mirror current is not generated in the verify mode. With this, in the verify mode, the reference current IR is generated based on the second mirror current that is proportional to the current flowing through the erased state-second reference cell R2 whose threshold voltage is low, and as a result, the reference current IR that moderately changes relative to that in the readout mode with respect to the change in the drive potential VWL applied to the cell can be generated. Accordingly, the determination reference can be precisely set when verifying whether or not a memory cell MC has been properly programmed to a programmed state in which the threshold voltage of the memory cell is high.

Also, the selection circuit 80 may set the connection state of the second reference cell R2 or the second current mirror circuit CM2 such that the second mirror current is generated in the verify mode, and the second mirror current is not generated in the readout mode. With this, the reference current IR can be generated, in the readout mode, at a high speed using only the intermediate state-first reference cell R1, and the operation margin can be increased compared with a case where both the first reference cell R1 and the second reference cell R2 are used, because the reference current IR changes similarly to the current IM of the memory cell MC with respect to a change in temperature or the power supply voltage.

Alternatively, the selection of the reference cells in the readout mode may be performed based on the power supply voltage (VDD–VSS) that is supplied to the memory control circuit 70. In this case, a voltage detection circuit 74 that activates a detection signal DET when the power supply voltage (VDD–VSS) is higher than a predetermined voltage is provided in the memory control circuit 70.

The selection control circuit 73 controls the selection circuit 80 such that, in the readout mode, the reference current IR is generated based on the first mirror current when the detection signal DET is activated, and the reference current IR is generated based on the first mirror current and the second mirror current when the detection signal DET is not activated.

Accordingly, when the power supply voltage (VDD–VSS) is relatively high, the reference current IR can be generated at a high speed using only the first reference cell R1. On the other hand, when the power supply voltage (VDD–VSS) is relatively low, although the intermediate state-first reference cell R1 is not easily turned on, the reference current IR can be generated using the second reference cell R2, even if the first reference cell R1 is not turned on.

According to the third exemplary configuration, as a result of providing the intermediate state-first reference cell whose threshold voltage is low relative to that in the programmed state, the current supply capability of the reference cell used for generating the reference current IR can be improved, and it is possible to reduce the time it takes for the reference current IR to stabilize in the readout mode. As a result, high-speed readout of data is made possible.

On the other hand, in the verify mode, the reference current IR is generated based on at least the second mirror current that is proportional to the current flowing through the erased state-second reference cell whose threshold voltage is low, and as a result, the reference current IR that moderately changes relative to that in the readout mode with respect to the change in the drive potential VWL applied to the cell can be generated, and the determination reference can be precisely set when verifying whether or not a memory cell MC has been properly programmed to the programmed state in which the threshold voltage of the memory cell is high.

Layout

Next, the layout of the nonvolatile memory device according to one embodiment of the invention will be described.

Figure 7:
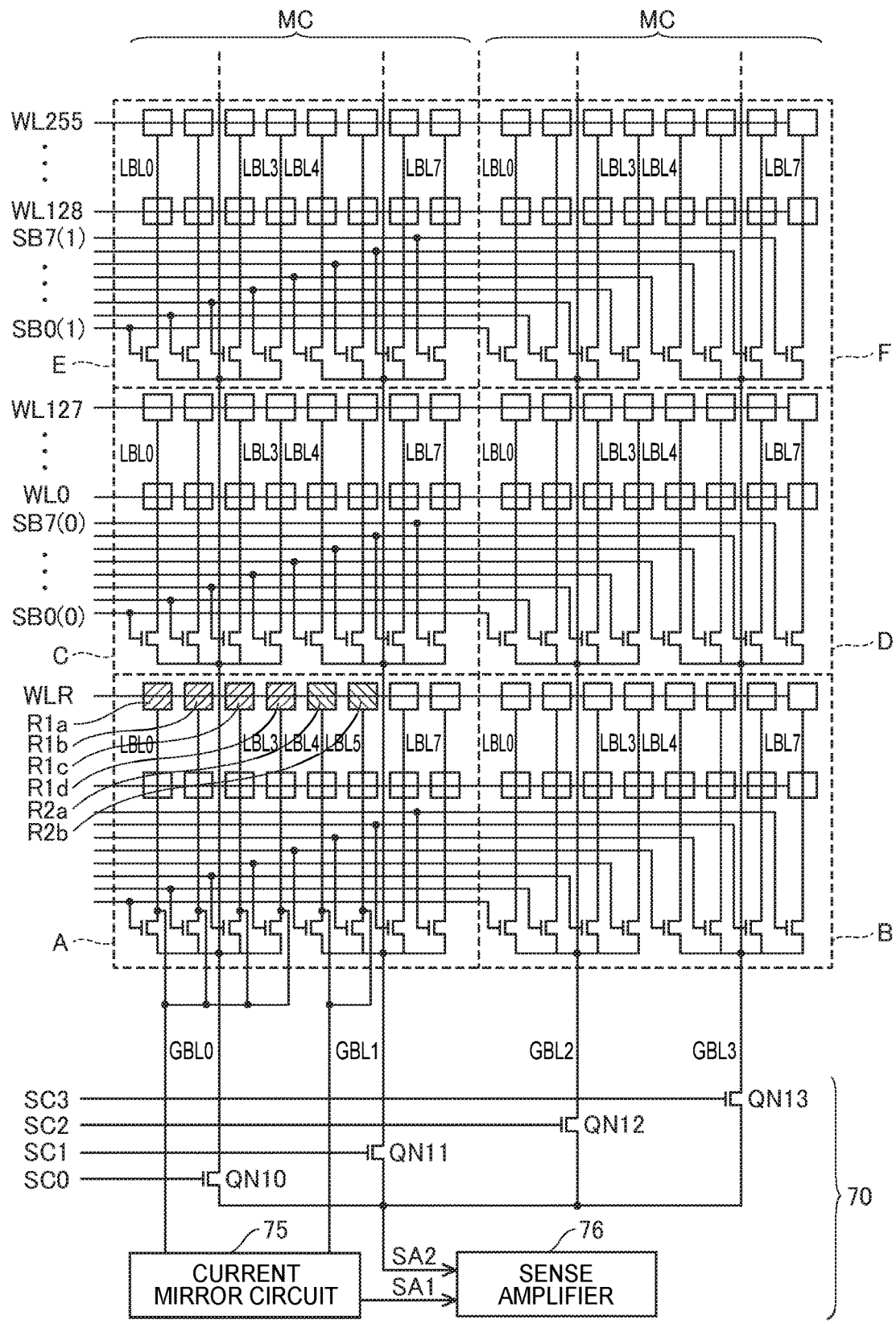
FIG. 7 is a connection diagram illustrating an exemplary arrangement of a plurality of reference cells and the like in the nonvolatile memory device.
Figure 8:
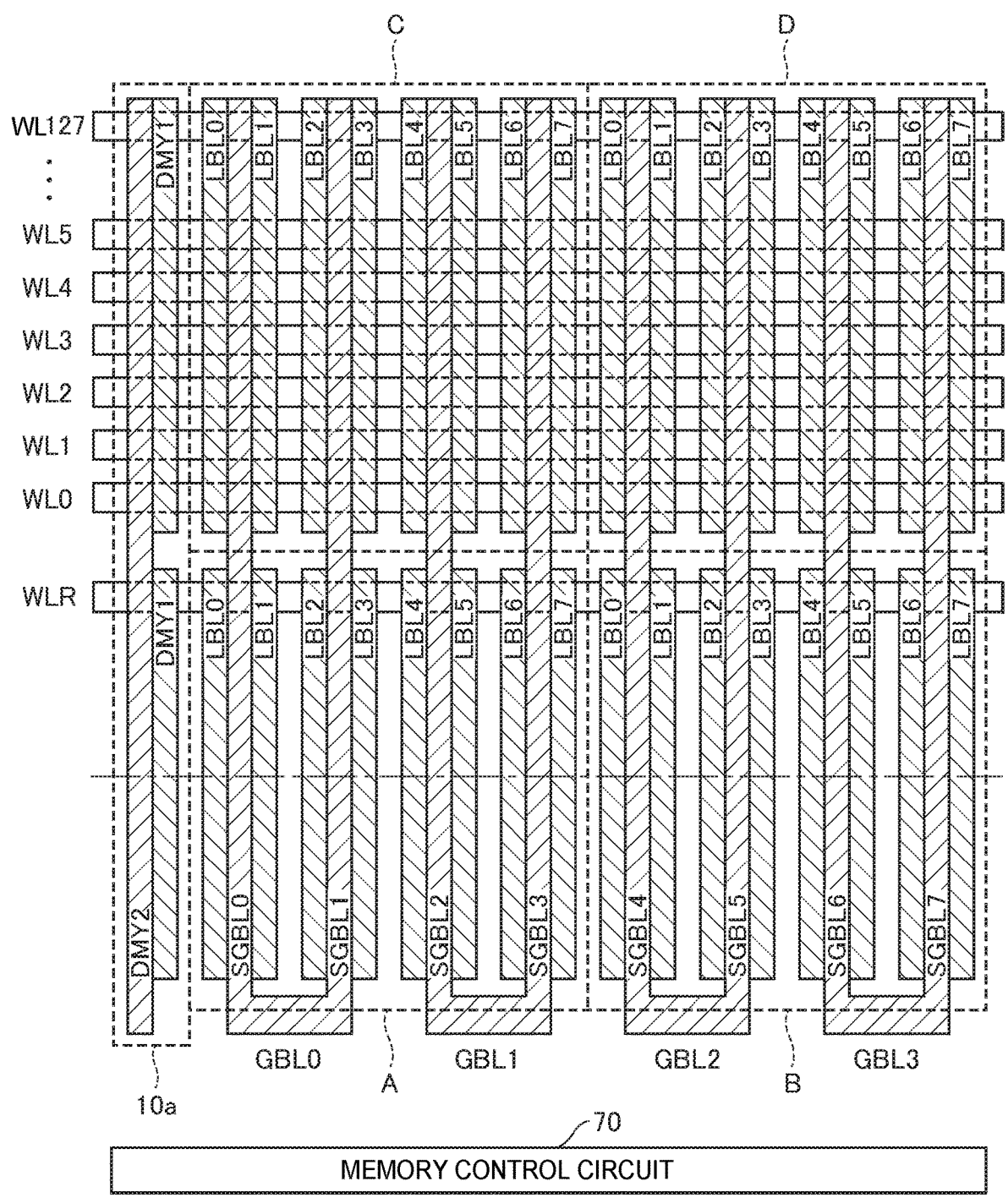
FIG. 8 is a plan view illustrating an exemplary pattern layout of word lines and bit lines shown in FIG. 7.

FIG. 7 is a connection diagram illustrating an exemplary arrangement of a plurality of reference cells and the like in the nonvolatile memory device shown in FIG. 1, and FIG. 8 is a plan view illustrating an exemplary pattern layout of word lines and bit lines shown in FIG. 7.

In this example, the region in which a plurality of memory cells and a plurality of reference cells are arranged is divided into a plurality of blocks. Blocks A to F of these blocks are shown in FIG. 7, and the blocks A to D are shown in FIG. 8. Also, as shown in FIG. 7, the memory control circuit 70 includes a current mirror circuit 75 and a sense amplifier 76. The current mirror circuit 75 includes the first current mirror circuit CM1 and the second current mirror circuit CM2 that are shown in FIG. 3, for example.

A plurality of first reference cells (first reference cells R1*a* to R1*d* are shown in FIG. 7, as an example) in the intermediate state between the erased state and the programmed state, and at least one second reference cell (second reference cells R2a and R2b are shown in FIG. 7, as an example) in the erased state are arranged in the block A.

The drains of the transistors of the first reference cells R1a to R1d are connected to the drain of the transistor QP1 (FIG. 3) in the current mirror circuit 75 via respective local bit lines (also simply referred to as "bit lines") LBL0 to LBL3. The drains of the transistors of the second reference cells R2a and R2b are connected to the drain of the transistor QP3 (FIG. 3) in the current mirror circuit 75 via respective local bit lines LBL4 and LBL5. Also, the drains of the transistors QP2 and QP4 (FIG. 3) in the current mirror circuit 75 are connected to a first input terminal of the sense amplifier 76 via an interconnect SA1.

In each block of the block C onward, a plurality of memory cells MC are arranged in a plurality of rows and a plurality of columns (128 rows×8 columns in FIG. 7), and the plurality of transistors in the switch circuit 60 (FIG. 2) are provided for each block. For example, the block C includes a plurality of word lines WL0 to WL127 and a plurality of local bit lines LBL0 to LBL7, for example.

The word line WLi is connected to gates of transistors of a plurality of memory cells MC arranged in the i-th row. Also, the local bit line LBLj is connected to drains of transistors of a plurality of memory cells MC arranged in the j-th column. A plurality of global bit lines GBL0 to GBL3 are each provided, in common, in a plurality of blocks that are successively arranged in a column direction, and are each connected to some of the plurality of local bit lines LBL0 to LBL7 in each block via respective transistors in each block.

Specifically, the global bit line GBL0 is connected to the local bit lines LBL0 to LBL3 in the blocks A, C, E, etc., via respective transistors in each block, the global bit line GBL1 is connected to the local bit lines LBL4 to LBL7 in the blocks A, C, E, etc., via respective transistors in each block.

Similarly, the global bit line GBL2 is connected to the local bit lines LBL0 to LBL3 in the blocks B, D, F, etc., via respective transistors in each block, the global bit line GBL3 is connected to the local bit lines LBL4 to LBL7 in the blocks B, D, F, etc., via respective transistors in each block.

A plurality of bit line selection signals for selecting local bit lines to be connected to the respective global bit lines are applied, from the memory control circuit 70, to gates of the plurality of transistors. Each transistor is turned on when the bit line selection signal that is applied to the gate thereof is activated to a high level, and connects the local bit line to the corresponding global bit line. Note that the transistors in the blocks A and B are always turned off in the readout mode and the verify mode.

Specifically, in each of the blocks C and D, bit line selection signals SB0(0) to SB7(0) are respectively applied to gates of eight transistors that are respectively connected to the local bit lines LBL0 to LBL7. Also, in each of the blocks E and F, bit line selection signals SB0(1) to SB7(1) are respectively applied to gates of eight transistors that are respectively connected to the local bit lines LBL0 to LBL7.

In the memory control circuit 70, a transistor QN10 is connected between the global bit line GBL0 and an interconnect SA2, and a transistor QN11 is connected between the global bit line GBL1 and the interconnect SA2. Also, the transistor QN12 is connected between the global bit line GBL2 and the interconnect SA2, and a transistor QN13 is connected between the global bit line GBL3 and the interconnect SA2. The interconnect SA2 is connected to a second input terminal of the sense amplifier 76.

Column selection signals SC0 to SC3 for selecting the global bit line to be connected to the sense amplifier 76 are respectively applied to gates of the transistors QN10 to QN13. Each of the transistors QN10 to QN13 is turned on when the column selection signal applied to the gate thereof is activated to a high level, and connects the corresponding global bit line to the interconnect SA2.

The nonvolatile memory device shown in FIG. 1 includes a conductive polysilicon layer arranged on a semiconductor substrate via an insulating film, and a plurality of interconnect layers that are arranged on the polysilicon layer via respective interlayer insulating films. For example, as shown in FIG. 8, the plurality of word lines WLR, WL0, WL1, etc. are arranged in the polysilicon layer, the plurality of local bit lines LBL0, LBL1, etc. are arranged in a first interconnect layer, and the plurality of global bit lines GBL0, GBL1, etc. are arranged in a second interconnect layer. Note that the interlayer insulating films are omitted in FIG. 8.

Here, each of the plurality of global bit lines GBL0, GBL1, etc. is branched into a plurality of sub-global bit lines. For example, the global bit line GBL0 is branched into two sub-global bit lines SGBL0 and SGBL1. Furthermore, the sub-global bit line SGBL0 is connected to the two local bit lines LBL0 and LBL1 in each of the plurality of blocks that are successively arranged in the column direction via respective transistors in each block. Also, the sub-global bit line SGBL1 is connected to the two local bit lines LBL2 and LBL3 in each of the plurality of blocks that are successively arranged in the column direction via respective transistors in each block.

The first reference cells R1a to R1d are arranged along a predetermined word line WLR, as shown in FIG. 7. Also, the second reference cells R2a and R2b are also arranged along the predetermined word line WLR. Accordingly, the control gates of the transistors of the first reference cells R1a to R1d or the transistors of the second reference cells R2a and R2b can be formed by a portion of the predetermined word line WLR.

Also, as shown in FIG. 8, the local bit lines LBL0 to LBL3 (block A) respectively connected to the first reference cells R1a to R1d (FIG. 7) are respectively arranged on lines extended from the plurality of local bit lines LBL0 to LBL3 (block C) respectively connected to a plurality of memory cells MC (FIG. 7). With this, data can be written into the first reference cells Ria to Rid similarly to the memory cells MC, and the first reference cells R1a to R1d can each be set to a desired memory state. Furthermore, because the memory control circuit 70 can be shared between the first reference cells R1a to R1d and the memory cells MC, the chip area can be reduced.

Also, the local bit lines LBL4 and LBL5 (block A) respectively connected to the second reference cells R2a and R2b (FIG. 7) are respectively arranged on lines extended from the local bit lines LBL4 and LBL5 (block C) respectively connected to a plurality of memory cells MC (FIG. 7). With this, data stored in the second reference cells R2a and R2b can be erased such that the second reference cells R2a and R2b are set to the erased state, similarly to the memory cells MC. Furthermore, because the memory control circuit 70 can be shared between the second reference cells R2a and R2b and the memory cells MC, the chip area can be reduced.

In the first interconnect layer in which the plurality of local bit lines LBL0 to LBL7 are arranged, dummy local bit lines (dummy interconnects) DMY1 are arranged adjacent to the respective local bit lines LBL0 at the end (left end in the diagram). Also, in the second interconnect layer in which the plurality of sub-global bit lines SGBL0 to SGBL7 are arranged, a dummy sub-global bit line (dummy interconnect) DMY2 is arranged adjacent to the sub-global bit line SGBL0 at the end (left end in the diagram). With this, the interlayer insulating film that is arranged on the interconnect layer can be planarized in a surrounding region 10a of the memory cell array.

In the example shown in FIG. 7, a plurality of reference cells are arranged in the column direction in the block A, and as a result, the reference cells that are to be actually used can be selected from these reference cells. On the other hand, minimum number of necessary reference cells may be arranged in the block A so as to reduce the sizes of the blocks A and B in the column direction relative to the other blocks.

Electronic Apparatus

Next, an electronic apparatus according to one embodiment of the invention will be described with reference to FIG. 9.

Figure 9:
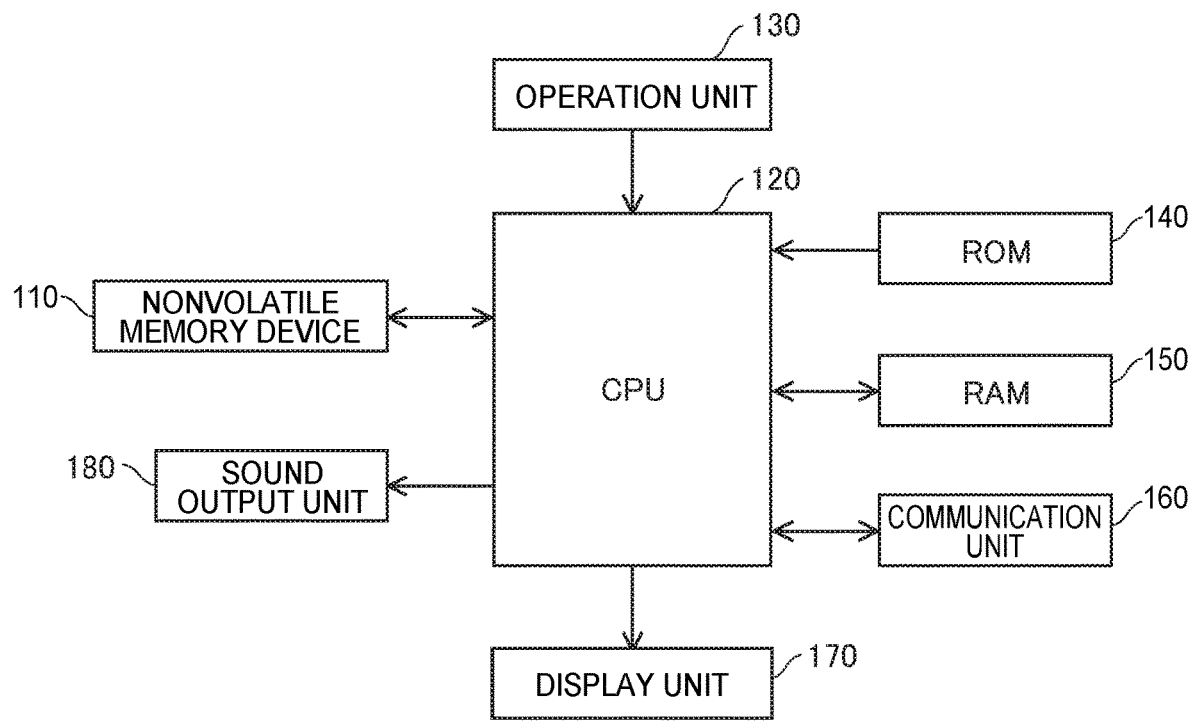
FIG. 9 is a block diagram illustrating an exemplary configuration of an electronic apparatus according to one embodiment of the invention.

FIG. 9 is a block diagram illustrating an exemplary configuration of the electronic apparatus according to one embodiment of the invention. As shown in FIG. 9, the electronic apparatus 100 includes a nonvolatile memory device 110 according to one embodiment of the invention, a CPU 120, an operation unit 130, a ROM (Read Only Memory) 140, a RAM (Random Access Memory) 150, a communication unit 160, a display unit 170, and a sound output unit 180. At least some of the constituent elements shown in FIG. 9 may be incorporated in a semiconductor device (IC). Note that some of the constituent elements shown in FIG. 9 may be omitted or changed, or another constituent element may be added to the constituent elements shown in FIG. 9.

The nonvolatile memory device 110 stores various types of data and the like. The CPU 120 performs various types of computation processing and control processing using data read out from the nonvolatile memory device 110 in accordance with a program stored in the ROM 140 or the like. For example, the CPU 120 performs various types of data processing in accordance with an operation signal supplied from the operation unit 130, controls the communication unit 160 for performing data communication with the outside, generates image signals for displaying various types of images in the display unit 170, and generates sound signals for outputting various types of sounds from the sound output unit 180, for example.

The operation unit 130 is an input device including an operation key, a button switch, and the like, and supplies an operation signal according to an operation made by a user to the CPU 120, for example. The ROM 140 stores programs for the CPU 120 to perform various types of computation processing and control processing. Also, the RAM 150 is used as a work area for the CPU 120, and temporarily stores a program read out from the ROM 140 or the like, data read out from the nonvolatile memory device 110, data that has been input using the operation unit 130, a result of computation that the CPU 120 has performed in accordance with a program, and the like.

The communication unit 160 is constituted by an analog circuit and a digital circuit, and performs data communication between the CPU 120 and an external device. The display unit 170 includes an LCD (liquid crystal display device) or the like, and displays various types of images in accordance with a display signal supplied from the CPU 120, for example. Also, the sound output unit 180 includes a speaker or the like, for example, and outputs various types of sounds based on a sound signal supplied from the CPU 120.

The electronic apparatus 100 includes a position determination function using GPS or the like, a body motion detection function using a body motion sensor or the like, a body information acquisition function using a pulse wave sensor or the like, a time measurement function, and the like, for example, and may be a wrist apparatus to be attached to a wrist or the like of a user.

In addition, the electronic apparatus 100 corresponds, for example, to a clock such as a sport watch or a table clock, a timer, a mobile apparatus such as a mobile phone or a mobile information terminal, an audio apparatus, a digital still camera, a digital video camera, a television, a TV phone, a security television monitor, a head-mounted display, a personal computer, a printer, a network apparatus, a multifunction peripheral, an on-board device (such as a navigation device), a calculator, an electronic dictionary, an electronic game machine, a robot, a measurement device, a medical apparatus (electronic thermometer, sphygmomanometer, blood glucose meter, electrocardiograph device, ultrasonic diagnostic apparatus, and electronic endoscope, for example), or the like.

According to the present embodiment, a semiconductor device or an electronic apparatus can be provided in which, in the nonvolatile memory device 110, the current supply capability of a reference cell used for generating the reference current is improved, and high-speed readout of data is made possible. Accordingly, as a result of storing the program in the nonvolatile memory device 110, the ROM 140 may be omitted, for example.

The invention is not limited to the embodiments described above, and many modifications can be made within the technical idea of the invention by a person having ordinary skill in the art. For example, a plurality of embodiments selected from the embodiments given above can be combined and implemented.

What is claimed is:

1. A nonvolatile memory device comprising:
   a plurality of first reference cells that are connected in parallel, and are in an intermediate state between an erased state and a programmed state, the intermediate state being a memory state in which a first current that flows through the plurality of first reference cells are: (i) smaller than a second current that flows through an erased memory cell, and (ii) larger than a third current that flows through a programmed memory cell;
   a first current mirror circuit that generates a first mirror current proportional to a sum of currents flowing through the plurality of first reference cells in a state in which the plurality of first reference cells are selected; and
   a sense amplifier that, in a readout mode, generates a reference current based on at least the first mirror current, and reads out data stored in a memory cell by comparing a current flowing through the memory cell with the reference current.

2. The nonvolatile memory device according to claim 1, further comprising:
   at least one second reference cell in the erased state;
   a second current mirror circuit that generates a second mirror current proportional to a current flowing through the at least one second reference cell in a state in which the at least one second reference cell is selected; and
   a selection circuit that sets a selection state of the plurality of first reference cells and the at least one second reference cell such that, in the readout mode, the reference current is generated based on at least the first mirror current, and in a verify mode, the reference current is generated based on at least the second mirror current.

3. The nonvolatile memory device according to claim 1, wherein a plurality of bit lines respectively connected to the plurality of first reference cells are respectively arranged on lines extended from a plurality of bit lines that are each connected to a plurality of memory cells.

4. The nonvolatile memory device according to claim 1, wherein at least one bit line that is connected to at least one second reference cell is arranged on a line extended from at least one bit line connected to at least one memory cell.

5. The nonvolatile memory device according to claim 1, wherein the plurality of first reference cells are arranged along a predetermined word line.

6. The nonvolatile memory device according to claim 5, wherein at least one second reference cell is arranged along the predetermined word line.

7. A nonvolatile memory device comprising:
a first reference cell in an intermediate state between an erased state and a programmed state;
a second reference cell in the erased state;
a first current mirror circuit that generates a first mirror current proportional to a current flowing through the first reference cell in a state in which the first reference cell is selected;
a second current mirror circuit that generates a second mirror current proportional to a current flowing through the second reference cell in a state in which the second reference cell is selected;
a sense amplifier that reads out data stored in a memory cell by comparing a current flowing through the memory cell with a reference current; and
a selection circuit that sets a selection state of the first and second reference cells such that, in a readout mode, the reference current is generated based on at least the first mirror current, and in a verify mode, the reference current is generated based on at least the second mirror current.

8. A semiconductor device comprising the nonvolatile memory device according to claim 1.

9. An electronic apparatus comprising the nonvolatile memory device according to claim 1.

10. A nonvolatile memory device comprising:
a plurality of first reference cells that are coupled in parallel, and are configured to be in an intermediate state between an erased state and a programmed state;
a second reference cell configured to be in the erased state;
a first current mirror circuit that is configured to generate a first current proportional to a sum of currents flowing through the plurality of first reference cells when the plurality of first reference cells are selected;
a sense amplifier that, in a readout mode, generates a reference current based on at least the first current, and reads out data stored in a memory cell by comparing a current flowing through the memory cell with the reference current;
a second current mirror circuit that is configured to generate a second current proportional to a current flowing through the second reference cell when the second reference cell is selected; and
a selector that is configured to select the plurality of first reference cells and the second reference cell such that, in the readout mode, the reference current is generated based on at least the first current, and in a verify mode, the reference current is generated based on at least the second current.

* * * * *